(12) United States Patent
Yamashita

(10) Patent No.: US 12,133,334 B2
(45) Date of Patent: Oct. 29, 2024

(54) MANAGEMENT DEVICE, MOUNTING DEVICE, MOUNTING SYSTEM, AND MANAGEMENT METHOD

(71) Applicant: FUJI CORPORATION, Chiryu (JP)

(72) Inventor: Yukihiro Yamashita, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 782 days.

(21) Appl. No.: 17/421,852

(22) PCT Filed: Jan. 30, 2019

(86) PCT No.: PCT/JP2019/003139
§ 371 (c)(1),
(2) Date: Jul. 9, 2021

(87) PCT Pub. No.: WO2020/157856
PCT Pub. Date: Aug. 6, 2020

(65) Prior Publication Data
US 2022/0110233 A1  Apr. 7, 2022

(51) Int. Cl.
*H05K 13/08* (2006.01)

(52) U.S. Cl.
CPC ................. *H05K 13/086* (2018.08)

(58) Field of Classification Search
CPC . H05K 13/086; H05K 13/0419; H05K 13/085
See application file for complete search history.

(56) References Cited

U.S. PATENT DOCUMENTS

| | | | | |
|---|---|---|---|---|
| 6,561,317 | B1* | 5/2003 | Dudley | A47F 9/00 312/198 |
| 8,805,236 | B2* | 8/2014 | Sato | G03G 15/0886 399/119 |
| 9,055,708 | B2* | 6/2015 | Kodama | H05K 13/087 |
| 9,494,328 | B2* | 11/2016 | Kawasaki | B08B 15/023 |
| 10,130,020 | B2* | 11/2018 | Nagata | H05K 13/08 |
| 10,342,170 | B2* | 7/2019 | Ikeda | B65H 75/4486 |
| 10,561,050 | B2* | 2/2020 | Iisaka | H05K 13/085 |

(Continued)

FOREIGN PATENT DOCUMENTS

WO  WO 2017/033268 A1  3/2017

OTHER PUBLICATIONS

International Search Report mailed on Apr. 23, 2019 in PCT/JP2019/003139 filed on Jan. 30, 2019 (2 pages).

*Primary Examiner* — Ramesh B Patel
(74) *Attorney, Agent, or Firm* — Oblon, McClelland, Maier & Neustadt, L.L.P.

(57) ABSTRACT

A management device includes a management control section configured to acquire the number of exchanges of the feeder which is exchanged due to component shortage within a predetermined period in a mounting installation section from which a mounting section is able to pick up a component, set the number of installation sections for exchange to be used for exchange of the feeder in a buffer installation section from which the mounting section is not able to pick up the component based on the acquired number of exchanges, and use the buffer installation section of the number of installation sections for changeover, which is based on the remaining number excluding the number of installation sections for exchange, in a pre-serving process of a changeover process of the feeder.

9 Claims, 6 Drawing Sheets

(56) References Cited

U.S. PATENT DOCUMENTS

| | | | |
|---|---|---|---|
| 11,240,949 B2* | 2/2022 | Kondo | H05K 13/086 |
| 11,464,145 B2* | 10/2022 | Yasui | H05K 13/086 |
| 11,864,324 B2* | 1/2024 | Yasui | H05K 13/085 |
| 11,943,873 B2* | 3/2024 | Kinoshita | H05K 13/0882 |
| 11,950,369 B2* | 4/2024 | Ohori | G05B 19/41865 |
| 2018/0150264 A1* | 5/2018 | Oguma | G06F 3/126 |
| 2018/0242485 A1 | 8/2018 | Kondo et al. | |
| 2023/0180449 A1* | 6/2023 | Minoshima | H05K 13/086 29/729 |
| 2023/0413501 A1* | 12/2023 | Yamashita | H05K 13/0417 |

* cited by examiner

| PREDETERMINED PERIOD | PRODUCTION | MOUNTING INSTALLATION SECTION NUMBER | | | | | | | | | | NUMBER OF EXCHANGES | NUMBER OF SECURED SECTIONS |
|---|---|---|---|---|---|---|---|---|---|---|---|---|---|
| | | #1 | #2 | #3 | #4 | #5 | #6 | #7 | #8 | #9 | #10 | | |
| 00:00 | | P01 | P02 | P03 | P04 | P05 | P06 | P07 | P08 | P09 | P10 | | 3 |
| 00:10 | | P01 | P02 | P03 | P04 | P05 | P06 | P07 | P08 | P09 | P10 | | 3 |
| 00:20 | PRODUCTION 1 | P01 | P02 | P03 | P04 | P05 | P06 | P07 | P08 | P09 | P10 | 1 | 3 |
| 00:30 | | P01 | P02 | P03 | P04 | P05 | P06 | P07 | P08 | P09 | P10 | | 3 |
| 00:40 | | P01 | P02 | P03 | P04 | P05 | P06 | P07 | P08 | P09 | P10 | 3 | 3 |
| 00:50 | PRODUCTION 2 | P01 | P11 | P03 | P12 | P13 | P06 | P14 | P15 | P09 | P10 | | 2 |
| 01:00 | | P01 | P11 | P03 | P12 | P13 | P06 | P14 | P15 | P09 | P10 | | 2 |
| ⋮ | ⋮ | ⋮ | | | | | | | | | | ⋮ | ⋮ |
| 03:00 | | P01 | P16 | P17 | P12 | P13 | P06 | P18 | P15 | P19 | P10 | 1 | 2 |
| 03:10 | PRODUCTION 3 | P01 | P16 | P17 | P12 | P13 | P06 | P18 | P15 | P19 | P10 | | 2 |
| 03:20 | | P01 | P16 | P17 | P12 | P13 | P06 | P18 | P15 | P19 | P10 | 2 | 2 |
| 03:30 | | P01 | P16 | P17 | P12 | P13 | P06 | P18 | P15 | P19 | P10 | 1 | 1 |
| ⋮ | ⋮ | ⋮ | | | | | | | | | | ⋮ | ⋮ |

※ P01 : FEEDER INCLUDING P01 COMPONENT TYPE

▨ : FEEDER REQUIRED TO BE EXCHANGED DUE TO COMPONENT SHORTAGE

NUMBER OF SECURED SECTIONS: NUMBER OF INSTALLATION SECTIONS FOR EXCHANGE OF BUFFER INSTALLATION SECTION USED FOR COMPONENT SHORTAGE EXCHANGE

Fig. 6

| PREDETERMINED PERIOD | PRODUCTION | MOUNTING INSTALLATION SECTION NUMBER ||||||||||  NUMBER OF EXCHANGES | NUMBER OF SECURED SECTIONS |
| --- | --- | --- | --- | --- | --- | --- | --- | --- | --- | --- | --- | --- | --- |
| | | #11 | #12 | #13 | #14 | #15 | #16 | #17 | #18 | #19 | #20 | | |
| 00:00 | PRODUCTION 1 | P11 | P12 | P13 | P14 | P15 | P16 | P17 | | | | | 3 |
| 00:10 | | P11 | P12 | P13 | P14 | P15 | P16 | P17 | P01 | | | | 3 |
| 00:20 | | P11 | P12 | P13 | P14 | P15 | P16 | P17 | P01 | | | 1 | 3 |
| 00:30 | | P11 | P12 | P13 | P14 | P15 | P16 | P17 | P03 | P09 | P10 | | 3 |
| 00:40 | | P11 | P12 | P13 | P14 | P15 | P16 | P17 | P03 | P09 | P10 | 3 | 3 |
| 00:50 | PRODUCTION 2 | P18 | P19 | P20 | P21 | P22 | P16 | P17 | P23 | | | | 2 |
| 01:00 | | P18 | P19 | P20 | P21 | P22 | P16 | P17 | P23 | | | | 2 |
| ⋮ | ⋮ | ⋮ |||||||||| ⋮ | ⋮ |
| 03:00 | PRODUCTION 3 | P24 | P25 | P20 | P21 | P22 | P26 | P27 | P23 | P06 | | 1 | 2 |
| 03:10 | | P24 | P25 | P20 | P21 | P22 | P26 | P27 | P23 | P01 | P10 | | 2 |
| 03:20 | | P24 | P25 | P20 | P21 | P22 | P26 | P27 | P23 | P01 | P10 | 2 | 2 |
| 03:30 | | P24 | P25 | P20 | P21 | P22 | P26 | P27 | P23 | P28 | P15 | 1 | 1 |
| ⋮ | ⋮ | ⋮ |||||||||| ⋮ | ⋮ |

※ P01 : FEEDER INCLUDING P01 COMPONENT TYPE

▒ : FEEDER REQUIRED TO BE EXCHANGED DUE TO COMPONENT SHORTAGE

NUMBER OF SECURED SECTIONS: NUMBER OF INSTALLATION SECTIONS FOR EXCHANGE OF BUFFER INSTALLATION SECTION USED FOR COMPONENT SHORTAGE EXCHANGE

MANAGEMENT DEVICE, MOUNTING DEVICE, MOUNTING SYSTEM, AND MANAGEMENT METHOD

TECHNICAL FIELD

The present description discloses a management device, a mounting device, a mounting system, and a management method.

BACKGROUND ART

In the related art, a mounting system has been proposed in which a feeder storage container is arranged in a production line, and an exchange robot (mobile work device) is provided which is moved between a mounting device and the feeder storage container and exchanges feeders (see Patent Literature 1, for example). In this mounting system, the feeder is exchanged by the mobile work device at the timing of exchanging the feeder.

PATENT LITERATURE

Patent Literature 1: International Publication No. 2017/033268

BRIEF SUMMARY

Technical Problem

Incidentally, in a mounting system, for example, when a production schedule of multiple types of boards is executed, there would be a case in which changeover process for exchanging the feeder is executed. In addition, in the mounting device, the feeder of component shortage may be exchanged during a mounting process. As described above, although there are multiple types of processes of exchanging the feeder, this point has not been specifically considered in Patent Literature 1, and it is desired to realize a more efficient exchange of the feeder.

The present disclosure is to provide a management device, a mounting device, a mounting system, and a management method which are capable of more efficiently executing exchange of a feeder.

The present disclosure has taken the following means to achieve the main object described above.

A management device which is used in a mounting system including a mounting device, the mounting device comprising: a mounting section configured to mount a component on a mounting target; a supply section configured to install a feeder configured to hold the component in an installation section, which includes a mounting installation section, from which the mounting section is enabled to pick up the component, and a buffer installation section, from which the mounting section is not enabled to pick up the component; and a mounting control section configured to cause the mounting section to pick up the component from the feeder, wherein the management device further comprises a management control section configured to acquire the number of exchanges of the feeder which is exchanged due to component shortage within a predetermined period in the mounting installation section, set the number of installation sections for exchange to be used for exchange of the feeder in the buffer installation section based on the acquired number of exchanges, and use the buffer installation section of the number of installation sections for changeover, which is based on the remaining number excluding the number of installation sections for exchange, in a pre-serving process of a changeover process of the feeder.

In this mounting device, the mounting installation section and the buffer installation section can be provided, and the feeder can be arranged in advance in the buffer installation section. In addition, for the utilization of the buffer installation section, in the management device, the number of exchanges of the feeder which is exchanged due to component shortage within the predetermined period is acquired, and the number of installation sections for exchange to be used for exchange of the feeder in the buffer installation section is set based on the acquired number of exchanges. In addition, in this management device, the buffer installation section of the number of installation sections for changeover, which is based on the remaining number excluding the number of installation sections for exchange, is used for the pre-serving process of the changeover process of the feeder. In this management device, the more appropriate number of installation sections for exchange can be secured, and furthermore, the remaining buffer installation sections can be more appropriately used for the changeover process. Therefore, in this management device, the exchange of the feeder can be executed more efficiently. Here, examples of the "mounting target" include, for example, a board or a substrate having a three-dimensional shape.

DESCRIPTION OF EMBODIMENTS

Figure 1:
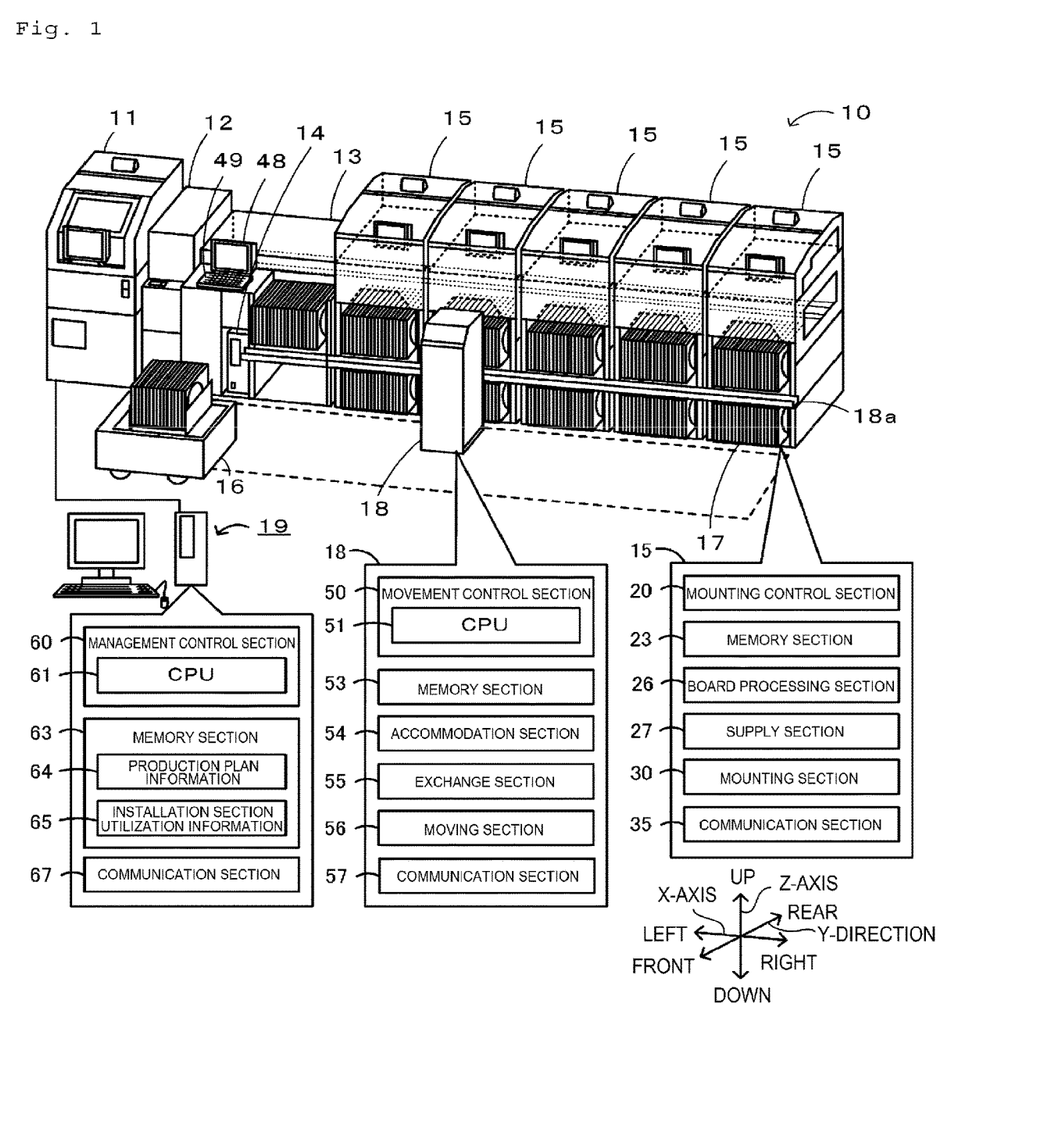
FIG. 1 is a schematic explanatory diagram showing an example of mounting system 10.
Figure 2:
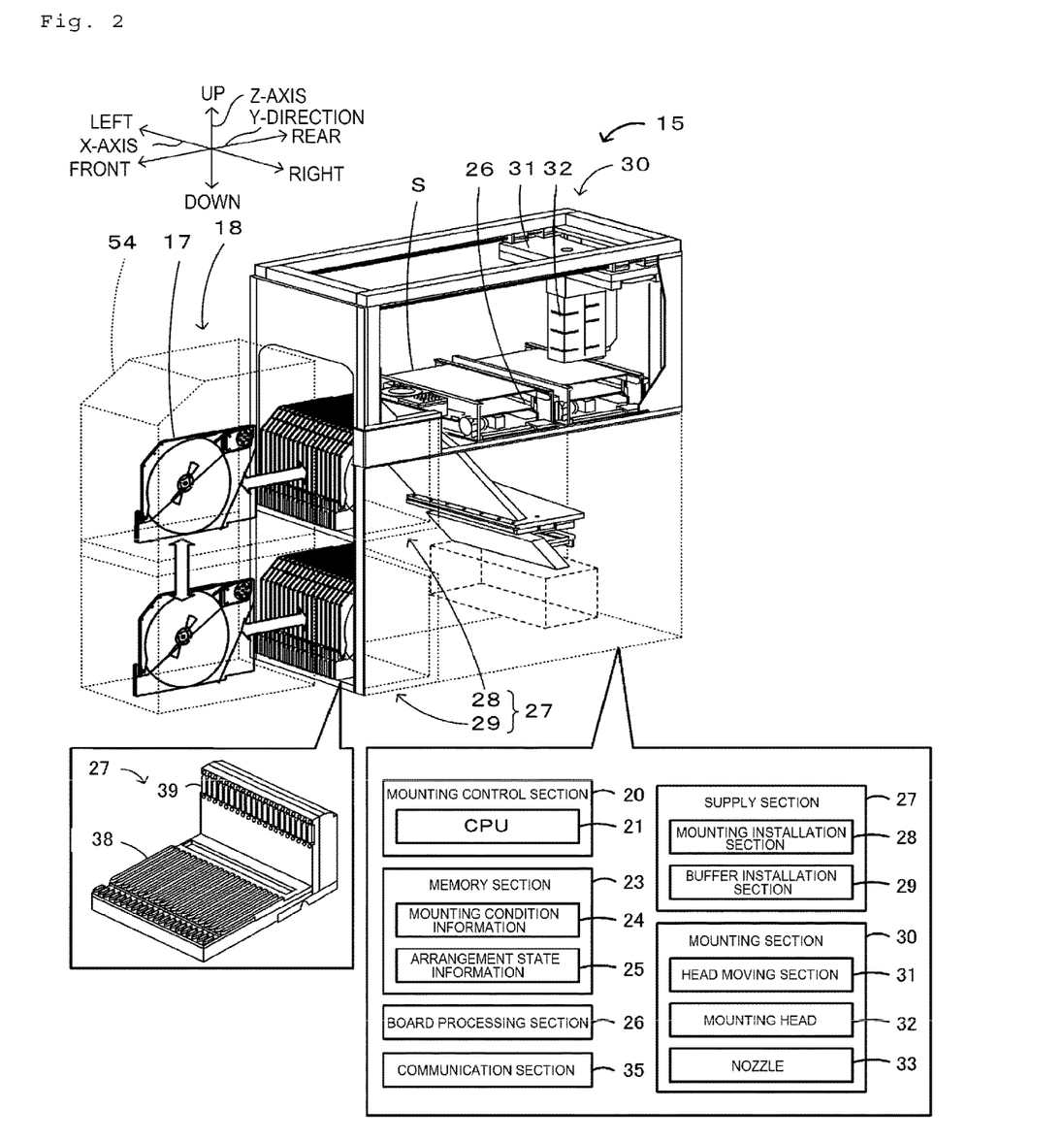
FIG. 2 is an explanatory diagram schematically showing a configuration of mounting device 15 and loader 18.
Figure 3:
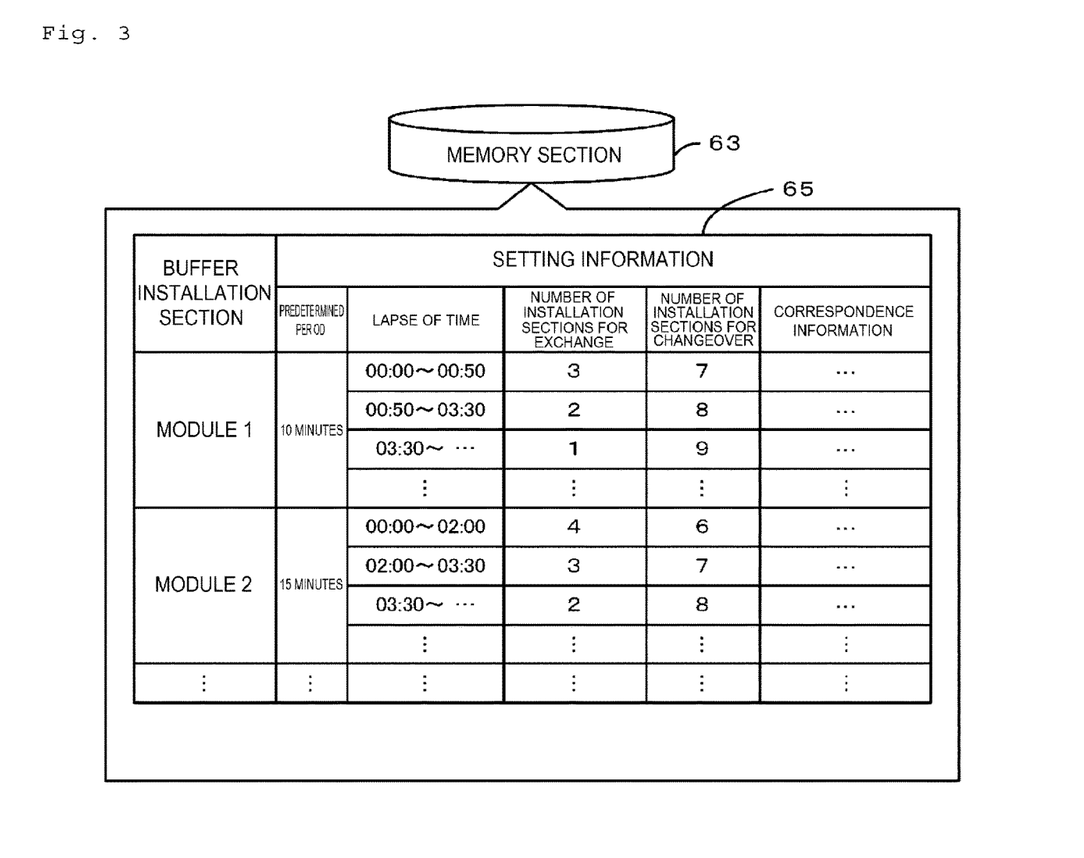
FIG. 3 is an explanatory diagram showing an example of installation section utilization information 65 memorized in memory section 63.

Hereinafter, the present embodiment will be described with reference to the drawings. FIG. 1 is a schematic explanatory diagram showing an example of mounting system 10 of the present disclosure. FIG. 2 is an explanatory diagram schematically showing a configuration of mounting device 15 and loader 18 which is a mobile work device. FIG. 3 is an explanatory diagram showing an example of installation section utilization information 65 memorized in memory section 63 of host PC 19. In the present embodiment, the right-left direction (X-axis), the front-rear direction (Y-axis), and the up-down direction (Z-axis) are as shown in FIGS. 1 and 2.

mounting system 10 is configured, for example, as a production line in which mounting devices 15 that mount components on board S which is a mounting target are arranged in the conveyance direction of board S. Here, the mounting target is described as board S, but is not particularly limited to this as long as the components are mounted, and a substrate having a three-dimensional shape may be adopted. As shown in FIG. 1, mounting system 10 includes printing device 11, print inspection device 12, feeder storage section 13, storage section PC 14, mounting device 15, automatic conveyance vehicle 16, loader 18, host PC 19, and the like. Printing device 11 is a device that prints solder paste or the like on board S. Print inspection device 12 is a device that inspects the state of the printed solder. Feeder storage section 13 is a storage location in which feeder 17 used in mounting device 15 is stored. Feeder storage section 13 is provided below a conveyance device between print inspection device 12 and mounting device 15.

Mounting device 15 is a device that picks up components and mounts the components on board S. Mounting device 15 includes mounting control section 20, memory section 23, board processing section 26, supply section 27, mounting section 30, and communication section 35. Mounting control section 20 is configured as a microprocessor centered on CPU 21 and controls the entire device, as shown in FIG. 2. Mounting control section 20 outputs control signals to board processing section 26, supply section 27, or mounting section 30 to cause mounting section 30 to pick up the components, and inputs signals from board processing section 26, supply section 27, or mounting section 30. Mounting condition information 24, arrangement state information 25, and the like are memorized in memory section 23. Mounting condition information 24 is a production job and includes information such as information on the components, the arrangement order in which the components are mounted on board S, the arrangement position, and the installation position of feeder 17 from which the components are picked up. Mounting condition information 24 is created by host PC 19 with a pick-up order and an arrangement order in which the mounting efficiency is high, transmitted from host PC 19, and memorized in memory section 23. Arrangement state information 25 is information including the type and the usage state of feeder 17 (component type, remaining number of components, and the like) which is currently installed in supply section 27 of mounting device 15. In a case in which feeder 17 is installed or released, arrangement state information 25 is appropriately updated with current content. Communication section 35 is an interface that performs exchange of information with external devices such as storage section PC 14 and host PC 19.

Board processing section 26 is a unit that performs carrying in, conveyance, fixation at a mounting position, and carrying out of board S. Board processing section 26 has a pair of conveyor belts which extend in the right-left direction and spaced apart from each other in the front-rear direction in FIG. 2. Board S is conveyed by the conveyor belts. Board processing section 26 includes two pairs of the conveyor belts, and can convey and fix two boards S simultaneously.

Supply section 27 is a unit that supplies the components to mounting section 30. Supply section 27 installs feeder 17, which has a reel around which a tape as a holding member that holds the components is wound, in one or more installation sections. As shown in FIG. 2, supply section 27 has two upper and lower installation sections to which feeder 17 can be installed in the front. The upper section is mounting installation section 28 from which the components can be picked up by mounting section 30, and the lower section is buffer installation section 29 from which the components cannot be picked up by mounting section 30. Here, mounting installation section 28 and buffer installation section 29 are collectively referred to as the installation section. The installation sections may be managed in module units grouped by a predetermined number (for example, 4 or 12). Feeder 17 from which the components are picked up by mounting head 32 is installed in mounting installation section 28. Buffer installation section 29 is used in a case in which feeder 17 which is to be used next or feeder 17 after being used is temporarily stored. Buffer installation section 29 is served in advance with feeder 17 for replenishment which is exchanged due to component shortage, feeder 17 for changeover which is used in the next production, or the like. In supply section 27, multiple slots 38 arranged in the X-direction at predetermined intervals, into which rail members of feeders 17 are inserted and connecting sections 39 into which connectors provided at the distal ends of feeders 17 are inserted are provided. Feeder 17 includes a controller (not shown). The controller memorizes information such as ID of the tape included in feeder 17, the component type, the remaining number of the components, or the like. In a case in which feeder 17 is connected to connecting section 39, the controller transmits the information of feeder 17 to mounting control section 20.

Mounting section 30 is a unit that picks up the components from supply section 27 and arranges the components on board S fixed to board processing section 26. Mounting section 30 includes head moving section 31, mounting head 32, and nozzle 33. Head moving section 31 includes a slider moved by being guided by guide rails in the XY-directions, and a motor that drives the slider. Mounting head 32 is configured to pick up one or more components and be moved in the XY-directions by head moving section 31. Mounting head 32 is installed in the slider in a detachable manner. One or more nozzles 33 are installed in the lower face of mounting head 32 in a detachable manner. Nozzle 33 is configured to pick up the components by using a negative pressure. Instead of nozzle 33, the pickup member that picks up the components may be a mechanical chuck or the like that mechanically holds components.

Storage section PC 14 is a device that manages feeder 17, memorizes execution data executed by loader 18, and manages loader 18. Storage section PC 14 includes a control section, a memory section, a communication section, display section 48, and input device 49. The control section is configured as a microprocessor centered on CPU, and controls the entire device. The memory section memorizes the mounting condition information, the arrangement state information, the installation section utilization information, and the like as information for controlling loader 18. Display section 48 is a liquid crystal display screen that displays various information. Input device 49 includes a keyboard, a mouse, and the like for inputting various instructions by an operator.

Automatic conveyance vehicle 16 is configured to automatically convey feeder 17, a member used in mounting system 10, or the like between a storage container (not shown) and feeder storage section 13.

Loader 18 is a mobile work device and is a device that is moved within a movement region at the front face of mounting system 10 (see a dotted line in FIG. 1) and automatically collects and replenishes feeders 17 of mounting device 15. Loader 18 includes movement control section 50, memory section 53, accommodation section 54, exchange section 55, moving section 56, and communication section 57. Movement control section 50 is configured as a microprocessor centered on CPU 51 and controls the entire device. Movement control section 50 controls the entire device to collect feeder 17 from supply section 27 or replenishes feeder 17 to supply section 27 to move feeder 17. Memory section 53 is configured to memorize various data such as processing programs, is HDD for example, and memorizes arrangement state information, installation section utilization information, and the like. Accommodation section 54 has an accommodation space in which feeders 17 are accommodated. Accommodation section 54 is configured to accommodate, for example, four feeders 17. Exchange section 55 is a mechanism that carries feeder 17 in and out and moves feeder 17 to upper and lower sections (see FIG. 2). Exchange section 55 has a clamp section that clamps feeder 17, a Y-axis slider the moves the clamp section in the Y-axis direction (front-rear direction), and a Z-axis slider that moves the clamp section in the Z-axis direction (up-down direction). Exchange section 55 executes installation and releasing of feeder 17 at mounting installation section 28 and installation and releasing of feeder 17 at buffer installation section 29. Moving section 56 is a mechanism that moves loader 18 in the X-axis direction (right-left direction) along X-axis rail 18a provided on the front face of mounting device 15. Communication section 57 is an interface that performs exchange of information with external devices such as storage section PC 14 and mounting device 15. Loader 18 outputs the current position and the executed work content to storage section PC 14.

Host PC 19 (see FIG. 1) is configured as a server that creates and manages information of each device in mounting system 10. Host PC 19 includes management control section 60 that controls the entire device, memory section 63 that memorizes various information, and communication section 67 that performs bidirectional communication with external devices such as mounting system 10, automatic conveyance vehicle 16, and loader 18. Memory section 63 memorizes production plan information 64, installation section utilization information 65, and the like. Production plan information 64 includes the entire information of board S manufactured by mounting system 10 as a production line. Production plan information 64 includes the order of the executed production jobs, the content of the production jobs (mounting condition information), and the like. As shown in FIG. 3, installation section utilization information 65 includes setting information such as usage conditions set for each module of the installation section. Installation section utilization information 65 includes, for example, a module number, a predetermined period set for each module, the lapse of time, the number of installation sections for exchange and the number of installation sections for changeover secured during the period, correspondence information of the installation section, and the like. The predetermined period is a time interval for counting the number of feeders 17 per unit time at which the component shortage occurs. The predetermined period is set based on, for example, a distance from feeder storage section 13 or a work time including the movement of loader 18, such as a time required for loader 18 to exchange feeder 17, or the like. Since the movement distance or the like from feeder storage section 13 differs between the modules of supply section 27 during the predetermined period, appropriate time is set for each module. the number of installation sections for exchange is determined based on the number of exchanges of feeder 17 due to the component shortage within the predetermined period, and is the number of installation sections of buffer installation sections 29 secured by the component shortage exchange. The number of installation sections for changeover is determined by subtracting the number of installation sections for exchange from the total number of installation sections of each module, and is the number of installation sections of buffer installation sections 29 used for the pre-serving process of the changeover process of the feeder executed before starting of each production. The correspondence information is, for example, information defining which feeder 17 is installed in which installation section of each module in a series of production jobs. Based on this correspondence information, loader 18 can install feeder 17 determined at a determined position of mounting installation section 28. Installation section utilization information 65 is created by host PC 19, transmitted from host PC 19, and memorized in the memory section of storage section PC 14. Host PC 19 creates and manages installation section utilization information 65 or mounting condition information used in the mounting process of the components, as well as acquires and manages information of mounting system 10.

Figure 4:
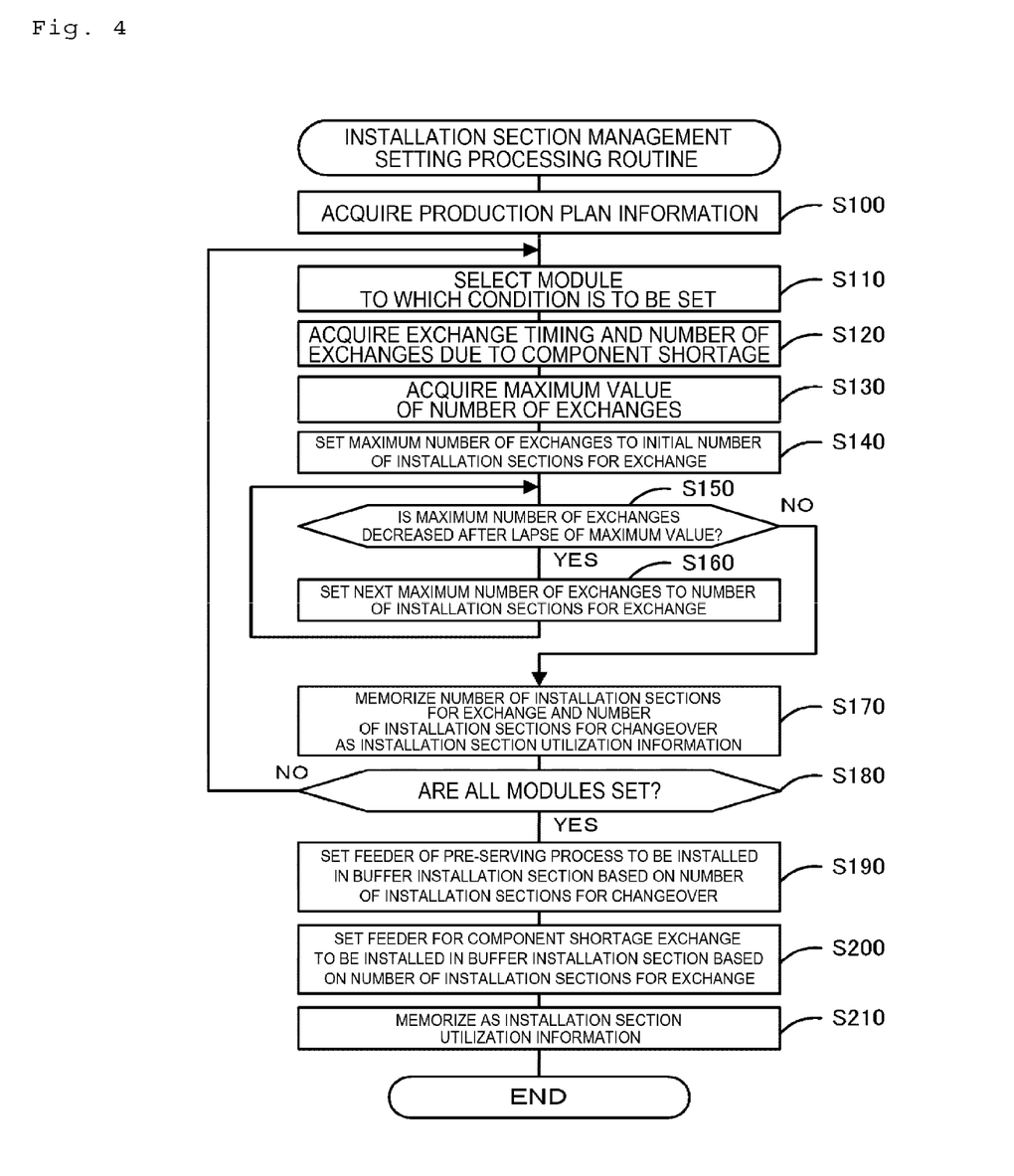
FIG. 4 is a flowchart showing an example of an installation section management setting processing routine.
Figure 5:
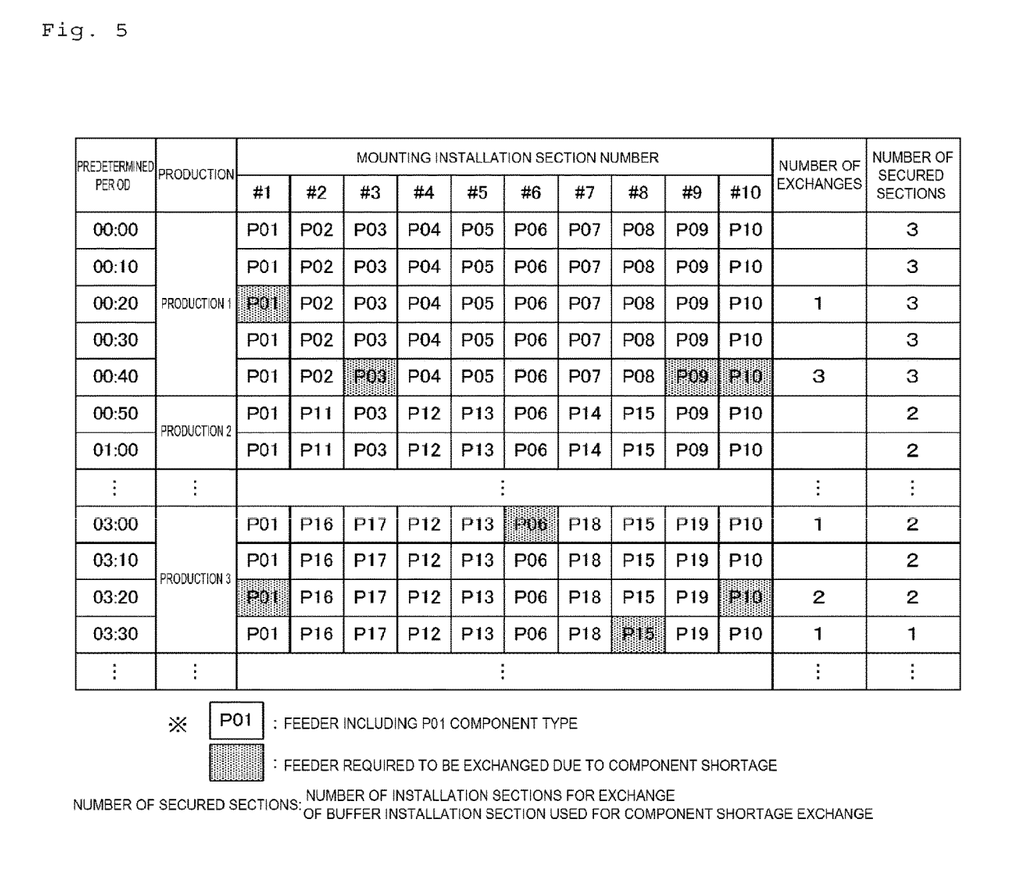
FIG. 5 is an explanatory diagram showing an example of installation section utilization information related to a mounting installation section.
Figure 6:
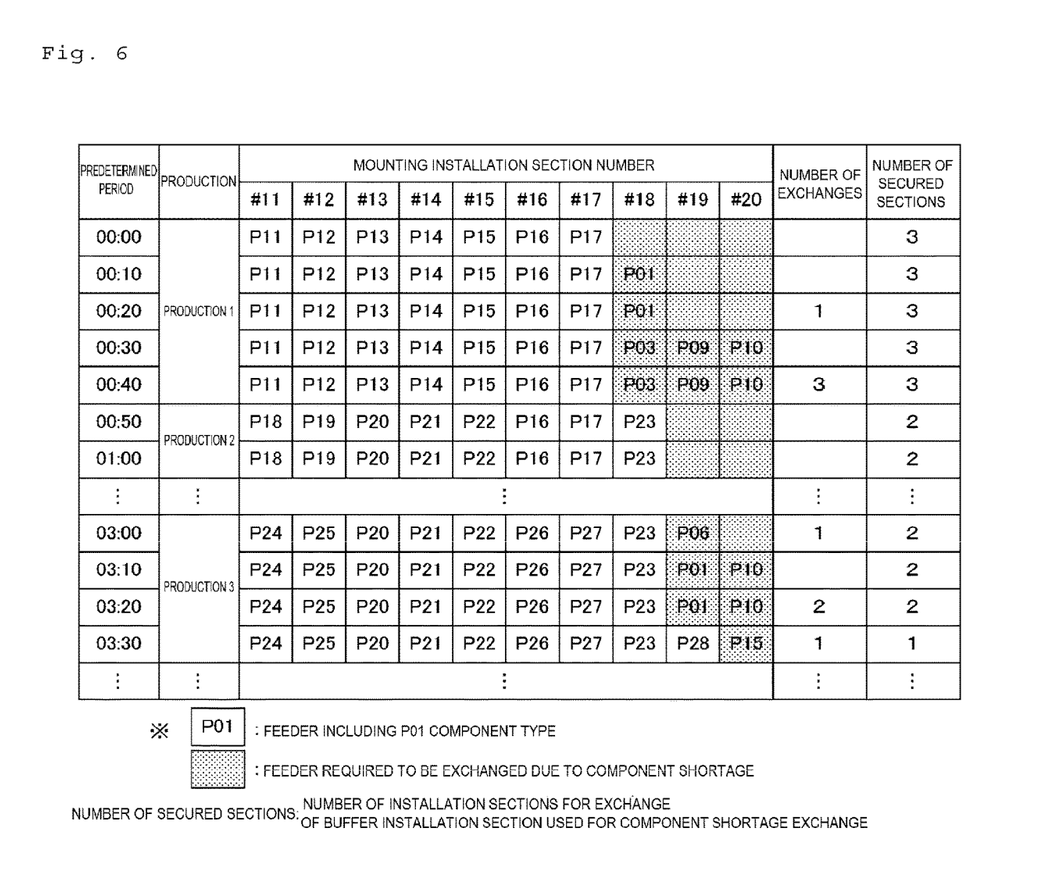
FIG. 6 is an explanatory diagram showing an example of installation section utilization information related to a buffer installation section.

Hereinafter, the operation of mounting system 10 according to the present embodiment configured as described above, particularly, the processing of causing host PC 19 to set installation section utilization information 65 will be described. FIG. 4 is a flowchart showing an example of an installation section management setting processing routine executed by CPU 61 included in management control section 60 of host PC 19. This routine is memorized in memory section 63 of host PC 19 and executed by a start instruction from the operator. FIG. 5 is an explanatory diagram showing an example of installation section utilization information related to mounting installation section 28. FIG. 6 is an explanatory diagram showing an example of installation section utilization information related to the buffer installation section. FIG. 5 shows the relationship between the lapse of the predetermined period and feeder 17 installed in mounting installation section 28 in the predetermined period. In addition, FIG. 5 shows an example of module 1 (see FIG. 3) of mounting installation section 28 in which the predetermined period is determined to be 10 minutes and the number of installation sections is 10. In FIGS. 5 and 6, feeder 17 (installation section) used for exchange due to component shortage is indicated by hatching, the component type included in feeder 17 is indicated by "P01" or the like, and the number of secured installation sections for exchange is indicated by "the number of secured sections". Hereinafter, the processing executed by CPU 61 will be specifically described with reference to FIGS. 5 and 6.

When this routine is started, CPU 61 reads out and acquires production plan information 64 from memory section 63 (S100), and selects a module of the installation section to which the condition is to be set (S110). CPU 61 can select modules, for example, in the order defined in the mounting condition information included in production plan information 64. Next, CPU 61 acquires the exchange timing and the number of exchanges of feeder 17 due to the component shortage in each predetermined period (S120). CPU 61 acquires the number of components included in feeder 17 which is installed in mounting installation section 28 and the number of used components per unit time from each mounting condition information included in production plan information 64, and acquires the timing of the component shortage of feeder 17 by calculation. CPU 61 performs the calculation of timing of the component shortage for each feeder 17 (mounting installation section 28) which is installed in each installation section. In addition, CPU 61 counts the number of exchanges for each predetermined period. For example, as shown in FIG. 5, in a predetermined period from 00:20 to 00:30, since one installation section number #1 is the exchange timing, the number of exchanges in that predetermined period is counted to 1. Similarly, in a predetermined period from 00:40 to 00:50, since three installation section numbers #3, #9, and #10 are the exchange timing, the number of exchanges in that predetermined periods is counted to three. CPU 61 performs such processing to acquire the number of exchanges of feeder 17 in the predetermined period from the beginning to the end.

Next, CPU 61 acquires the maximum value of the acquired number of exchanges (S130), and sets the maximum value to the initial number of installation sections for exchange (S140). For example, in FIG. 5, since the maximum value of the number of exchanges in the whole is "3", this "3" is set to the number of installation sections for exchange. Since the number of installation sections for exchange is the number of installation sections of buffer installation sections 29 secured for the exchange of the component shortage, loader 18 can execute the exchange of feeder 17 by using secured buffer installation sections 29. Next, CPU 61 determines whether or not the next maximum number of exchanges after the lapse of the predetermined period which indicates the maximum number of exchanges is decreased from the current maximum number of exchanges (S150), and in a case in which the maximum number of exchanges is decreased, sets the value of the subsequent maximum number of exchanges to the number of installation sections for exchange in the following predetermined period (S160). After S160, CPU 61 repeatedly executes the processing in and after S140. That is, in a case in which the next maximum number of exchanges after the current maximum number of exchanges has elapsed is decreased from the current maximum number, CPU 61 resets the decreased maximum number of exchanges to the subsequent number of installation sections for exchange. In mounting device 15, for example, in a case in which there is a free installation section in buffer installation section 29, another feeder 17 for replenishment such as changeover may be served in advance, and there may be almost no free installation section. As described above, once any feeder 17 is installed in buffer installation section 29, it is difficult to provide a free buffer installation section 29 for component shortage exchange. In mounting system 10, first, free installation sections of the maximum number of exchanges are secured. In addition, in a case in which the maximum number of exchanges is decreased in a subsequent predetermined period, since it is wasteful to secure a lot of free buffer installation sections 29, CPU 61 sets the next maximum number of exchanges to the number of installation sections for exchange thereafter. In FIG. 5, CPU 61 secures three installation sections for exchange until the predetermined period of 00:40 to 00:50, and then secures two installation sections for exchange since the subsequent maximum number of exchanges is decreased to "2" in a predetermined period of 03:20 to 03:30. In addition, since the subsequent maximum number of exchanges is decreased to "1" in a predetermined period from 03:30 to 03:40, one installation section is secured for exchange.

On the other hand, in a case in which the maximum number of exchanges is not further decreased in S150, CPU 61 memorizes the number of installation sections for exchange and the number of installation sections for changeover in installation section utilization information 65 to secure the current maximum number of exchanges to the end (S170). CPU 61 sets a value obtained by subtracting the number of installation sections for exchange from the total number of installation sections of the modules to the number of installation sections for changeover such that there is no free installation section. The number of installation sections for changeover is not limited to this setting method, and may be set by providing a margin (1, 2, or the like) of a predetermined number of installation sections. Subsequently, CPU 61 determines whether or not the number of installation sections for exchange and the number of installation sections for changeover are set for all the modules (S180), and in a case in which the numbers are not set for all the modules, executes the processing in and after S110 repeatedly. That is, CPU 61 selects the next module, and sets the maximum number of exchanges within a predetermined period to the number of installation sections for exchange (the number of secured sections). As described above, CPU 61 sets the number of installation sections for exchange for each module of supply section 27.

On the other hand, in a case in which the numbers are set for all the modules in S180, CPU 61 executes the setting process of feeder 17 which is installed in buffer installation section 29 (S190 to S210). Specifically, CPU 61 sets feeder 17 for changeover which is installed in buffer installation section 29 in the pre-serving process of the changeover process, based on the mounting condition information and the number of installation sections for changeover (S190). For example, as shown in FIG. 5, in production 1 and production 2, it is necessary to perform changeover process of exchanging feeder 17, for example, from component P02 to component P11, or from component P04 to component P12. In this process, in a case in which feeder 17 for changeover is served in advance to buffer installation section 29, loader 18 can execute the exchange of feeder 17 by an extremely small movement distance, so that the production time can be shortened. Here, as shown in FIG. 6, CPU 61 sets feeder 17 for changeover which has components P11 to P15 to be served in advance to buffer installation section 29 of the number of installation sections for changeover excluding the number of installation sections for exchange. In addition, since there is a free installation section, CPU 61 sets feeder 17 for changeover which has components P16 to P17 used in production 3 to be served in advance to buffer installation section 29. In this case, in addition to or instead of setting feeder 17 for changeover of production 3, in a case in which there is feeder 17 for changeover in another module in the vicinity of production 2, in which there is no free installation section and pre-serving cannot be executed, CPU 61 may set feeder 17 for changeover to be served in advance to buffer installation section 29 of this module. As a result, loader 18 can perform, in the changeover process, exchange of feeder 17 by a shorter movement distance than the movement with feeder storage section 13.

Next, CPU 61 sets feeder 17 for component shortage exchange which is installed in advance in buffer installation section 29 based on the number of installation sections for exchange (S200), memorizes the information of feeder 17 set in S190 and S200 in installation section utilization information 65 (S210), and terminates this routine. In S200, as shown in FIG. 5, since the component shortage occurs in feeder 17 of installation section number #1 in the predetermined period from 00:20 to 00:30, CPU 61 sets feeder 17 for component shortage exchange which is installed in installation section number #18 in a predetermined period earlier than the occurrence of component shortage, as shown in FIG. 6. Similarly, since the component shortage occurs in feeders 17 of installation section numbers #3, #9, and #10 in the predetermined period of 00:40 to 00:50, CPU 61 sets feeders 17 for component shortage exchange which are installed in installation section numbers #18 to #20 in a predetermined period earlier than the occurrence of component shortage. As described above, since feeder 17 for component shortage exchange is installed in buffer installation section 29 in advance, loader 18 can exchange feeder 17 by a short movement distance, so that the production time can be further shortened. In S210, CPU 61 memorizes the setting content of each installation section shown in FIGS.

5 and 6 in the correspondence information of installation section utilization information 65. It should be noted that in FIG. 6, the installation sections for changeover are denoted by installation section numbers #11 to #17, and the installation sections for exchange are denoted by installation section numbers #18 to #20, but the positions thereof can be optionally determined. In addition, although feeder 17 is not immediately installed in the installation section for exchange, feeder 17 for component shortage exchange may be installed in the installation section for exchange at the time of starting each production.

Next, the work of loader 18 using installation section utilization information 65 and the mounting process of mounting device 15 using mounting condition information 24 will be described. In a case in which installation section utilization information 65 created by host PC 19 is acquired, storage section PC 14 commands the work contents to loader 18. Loader 18 executes the work such as movement or exchange of feeder 17 in accordance with a command from storage section PC 14. For example, when production 1 is started loader 18 installs corresponding feeders 17 to installation section numbers #1 to #10 of module 1 of mounting installation section 28 and further installs corresponding feeder 17 to the installation sections of module 2 and subsequent modules. Loader 18 installs feeder 17 in mounting installation section 28 in the order from mounting device 15 on the more upstream side. In a case in which feeder 17 is installed in all of mounting installation sections 28, loader 18 installs corresponding feeder 17 to installation section numbers #11 to #20 of module 1 of buffer installation section 29 and further installs corresponding feeder 17 to the installation sections of module 2 and subsequent modules. In a case in which feeder 17 is installed in mounting installation section 28 and can be subjected to the mounting process, mounting device 15 executes the mounting process of picking up the components from feeder 17 and arranges the components on board S based on mounting condition information 24. In this case, mounting device 15 may be configured to acquire installation section utilization information 65 from host PC 19, and secure buffer installation sections 29 of the number of installation sections for exchange for exchanging the component shortage feeder. For example, mounting control section 20 of mounting device 15 may notify the operator of warning by displaying or voice outputting in a case in which feeder 17 different from the schedule is installed in the secured installation section for exchange. In addition, mounting control section 20 uses buffer installation sections 29 of the number of installation sections for changeover for the pre-serving process of the changeover process of feeder 17. Thereafter, loader 18 installs feeder 17 for component shortage exchange in the installation section for exchange before the component shortage of feeder 17 occurs. In mounting device 15, since the installation section for exchange is secured in advance in buffer installation section 29, feeder 17 for component shortage replenishment can be installed in advance in buffer installation section 29. Then, in mounting device 15, in a case in which the component shortage occurs in feeder 17, signals are output to storage section PC 14. Storage section PC 14 that receives the signal commands loader 18 to exchange component shortage feeder 17 and feeder 17 for replenishment which is installed in buffer installation section 29. Loader 18 that receives the command executes the exchange process of feeder 17. As described above, in mounting system 10, the mounting process, the exchange of feeder 17 of the component shortage, or the like can be smoothly executed.

Here, the correspondence relationships between the constituent elements in the present embodiment and the constituent elements in the present disclosure will be clarified. Mounting device 15 according to the present embodiment corresponds to a mounting device, host PC 19 corresponds to a management device, and loader 18 corresponds to a mobile work device. In addition, management control section 60 corresponds to a management control section, supply section 27 corresponds to a supply section, mounting installation section 28 and buffer installation section 29 correspond to an installation section, mounting section 30 corresponds to a mounting section, and mounting control section 20 corresponds to a mounting control section. In addition, board S corresponds to a mounting target. In the present embodiment, an example of a management method of the present disclosure is also disclosed by explaining the operation of management control section 60.

Mounting system 10 described above includes mounting device 15 including mounting section 30 configured to mount the components on board S, supply section 27 configured to install feeder 17 configured to hold the components in the installation section which includes mounting installation section 28 from which mounting section 30 can pick up the components and buffer installation section 29 from which the mounting section 30 cannot pick up the components, and mounting control section 20 configured to cause mounting section 30 to pick up the components from feeder 17. Host PC 19 is a management device used in mounting system 10, and includes management control section 60. In mounting device 15, mounting installation section 28 and buffer installation section 29 can be provided, and feeder 17 can be arranged in advance in buffer installation section 29. In addition, with respect to the utilization of buffer installation section 29, host PC 19 acquires the number of exchanges of feeder 17 which is exchanged due to component shortage within the predetermined period, and sets the number of installation sections for exchange used for exchanging the feeder in buffer installation section 29 based on the acquired number of exchanges. In addition, in host PC 19, buffer installation section 29 of the number of installation sections for changeover, which is based on the remaining number excluding the number of installation sections for exchange, is used for the pre-serving process of the changeover process of feeder 17. In host PC 19, the more appropriate number of installation sections for exchange can be secured, and further, the remaining buffer installation sections can be used for the changeover process more appropriately. Therefore, in host PC 19, the exchange of feeder 17 can be executed more efficiently.

In addition, since management control section 60 sets the maximum number of exchanges among the number of exchanges for each predetermined period in the production plan of board S to the number of installation sections for exchange, the minimum number of buffer installation sections can be secured as much as possible to handle the component shortage that occurs simultaneously within the predetermined period. In addition, host PC 19 can more reliably and efficiently exchange component shortage feeder 17. Further, after setting the maximum number of exchanges of feeder 17 within the predetermined period in the production plan of board S to the number of installation sections for exchange, management control section 60 resets the next maximum number of exchanges to the number of installation sections for exchange in a case in which the maximum number of exchanges is decreased after the predetermined period of the maximum number of exchanges has elapsed. In host PC 19, since the number of installation sections for exchange is sequentially updated to the maximum number of exchanges during the predetermined period, the necessary number of installation sections for exchange can be set, and buffer installation sections 29 can be used without waste. Furthermore, since supply section 27 is configured to include multiple modules, and management control section 60 sets the number of installation sections for exchange for each module, the exchange of feeder 17 can be executed more efficiently for each module. In addition, since each of the predetermined periods is set for each module for which the time required to exchange or move feeder 17 is different, host PC 19 can appropriately set the number of installation sections for exchange, and the exchange of the feeder can be executed more efficiently.

In addition, since management control section 60 use, in a case in which the module has free buffer installation section 29, free buffer installation section 29 for the preserving process of the changeover process of feeder 17 of another module, buffer installation section can be used for the pre-serving process as much as possible, and the exchange of feeder 17 can be executed more efficiently. Further, mounting system 10 includes loader 18 including movement control section 50 that collects feeder 17 from supply section 27 or replenishes feeder 17 to supply section 27 to move feeder 17, and the predetermined period is set based on the work time including the movement of loader 18. Since loader 18, which is a mobile work device, has various movement time between the receiving position of feeder 17 (feeder storage section 13) and buffer installation section 29, the exchange time of feeder 17, and the like, host PC 19 can more efficiently execute the exchange of feeder 17 by considering such the work time. In addition, since supply section 27 is configured to include the multiple modules and the predetermined period is set for each module for which the movement time of loader 18 is different, the exchange of feeder 17 can be further appropriately executed.

In addition, in mounting device 15, since buffer installation sections 29 of the number of installation sections for exchange set by host PC 19 are secured, the exchange of feeder 17 can be executed more efficiently. In addition, since mounting system 10 includes host PC 19 and mounting device 15 which are described above, the exchange of feeder 17 can be executed more efficiently.

It is obvious that the present disclosure is not limited to the above-described embodiment and can be implemented in various modes as long as the modes belong to the scope of the present disclosure.

For example, in the embodiment described above, the maximum number of exchanges among the number of exchanges for each predetermined period is set to the number of installation sections for exchange, but the present disclosure is not particularly limited to this, and the number of exchanges equal to or less than the maximum number of exchanges may be set to the number of installation sections for exchange, or the number of exchanges equal to or larger than the maximum number of exchanges may be set to the number of installation sections for exchange. For example, the number of installation sections for exchange may be a value in which the margin is included in the maximum number of exchanges, or may be a value obtained by subtracting the margin from the maximum number of exchanges. It is most efficiently preferable that the number of installation sections for exchange be the maximum number of exchanges.

In the embodiment described above, in a case in which the maximum number of exchanges is decreased after the predetermined period of the maximum number of exchanges has elapsed, the next maximum number of exchanges is reset to the number of installation sections for exchange, but this may be omitted. Also in this host PC 19, the installation section for component shortage exchange can be secured.

In the embodiment described above, supply section 27 includes the multiple modules, and the number of installation sections for exchange is determined for each module, but the present disclosure is not particularly limited to this, and the number of installation sections for exchange may be determined for each module. In addition, although the predetermined period is determined for each module, the present disclosure is not particularly limited to this, and the predetermined period may not be determined for each module. Any one or more of these setting values may be set not by any unit instead of a module unit of installation section, or may be set as a common value between the modules. Further, although supply section 27 includes the multiple modules, the present disclosure is not particularly limited to this, and supply section 27 may not include the module. Also in host PC 19, since the installation section for exchange can be secured, the exchange of the feeder can be executed more efficiently.

In the embodiment described above, in a case in which free buffer installation section 29 is present in the module of supply section 27, free buffer installation section 29 is used for the pre-serving process of the changeover process of feeder 17 of another module, but the present disclosure is not particularly limited to this, and free buffer installation section 29 may not be used for the pre-serving process of another module. Also in this host PC 19, since the installation section for exchange can be secured in its own module, the exchange of the feeder can be executed more efficiently.

In the embodiment described above, mounting device 15 is configured to use installation section utilization information 65 to secure buffer installation sections 29 of the number of installation sections for exchange, but the present disclosure is not particularly limited to this, and mounting device 15 may be configured not to perform the management of the installation section. Even in this case, in a case in which loader 18 cannot install feeder 17 for changeover in predetermined buffer installation section 29, the installation section for component shortage exchange can be secured in buffer installation section 29.

In the embodiment described above, host PC 19 is configured to set the number of installation sections for exchange and set the number of installation sections for changeover, but the present disclosure is not particularly limited to this, and the number of installation sections for changeover may not be particularly set. That is, only the number of installation sections for exchange may be set, and how to use the remaining installation sections may not be set. Alternatively, although the number of installation sections for exchange is set in the embodiment described above, the number of installation sections for exchange may be relatively determined by setting the number of installation sections for changeover. The number of installation sections may be optionally set as long as the installation section for component shortage exchange can be secured.

In the embodiment described above, installation section utilization information 65 is created by host PC 19, but the present disclosure is not particularly limited to this as long as it is a device used for mounting system 10, and installation section utilization information 65 may be created by storage section PC 14, or may be created by mounting device 15 or loader 18. Similarly, the control section that creates installation section utilization information 65 may be provided in storage section PC 14, mounting device 15, loader 18, or the like.

In the embodiment described above, the present disclosure is applied to the modes of mounting system 10 and host PC 19, but the present disclosure may be used as a management method, or may be used as a program that causes a computer to execute each step of the management method.

Here, the management device, the mounting device, the mounting system, and the management method according to the present disclosure may be configured as follows. For example, in the management device according to the present disclosure, the management control section may be configured to set the number of exchanges, which is equal to or less than a maximum value among the number of exchanges for each predetermined period, to the number of installation sections for exchange in a production plan of the mounting target. In this management device, a minimum number of buffer installation sections can be secured as much as possible to handle the component shortage that occurs simultaneously within the predetermined period. In this management device, it is preferable that the maximum number of exchanges among the number of exchanges of the feeders which is exchanged within the predetermined period be set to the number of installation sections for exchange. In this management device, the component shortage feeder can be more reliably and efficiently exchanged.

In the management device of the present disclosure, the management control section may be configured to set a maximum number of exchanges of the feeder within the predetermined period to the number of installation sections for exchange in a production plan of the mounting target, and then reset a next maximum number of exchanges to the number of installation sections for exchange in a case in which the maximum number of exchanges is decreased after a predetermined period of the maximum number of exchanges has elapsed. In this management device, since the number of installation sections for exchange is sequentially updated to the maximum number of exchanges during the predetermined period, the necessary number of installation sections for exchange can be set, and the buffer installation sections can be used without waste.

In the management device of the present disclosure, the supply section may include multiple modules, and the management control section may be configured to set the number of installation sections for exchange for each module. In this management device, the exchange of the feeder can be executed more efficiently for each module. In the management device in which the number of installation sections for exchange is set for each module, the predetermined period may be set for each module. Since each module may require a different time to exchange or move the feeder, in this management device, the number of installation sections for exchange can be appropriately set by setting the predetermined period for each module, and the exchange of the feeder can be executed more efficiently.

In the management device of the present disclosure, the supply section may include multiple modules, and the management control section may be configured to, in a case in which the module has a free buffer installation section, use the free buffer installation section for the pre-serving process of the changeover process of the feeder of another module. In this management device, since the buffer installation section can be used for the pre-serving process as much as possible, the exchange of the feeder can be executed more efficiently.

In the management device of the present disclosure, the mounting system may include a mobile work device including a movement control section configured to collect the feeder from the supply section or replenishes the feeder to the supply section to move the feeder, and the predetermined period may be set based on a work time including movement of the mobile work device. Since the mobile work device has various movement time between the receiving position of the feeder and the buffer installation section, the exchange time of the feeder, and the like, the management device can more efficiently execute the exchange of the feeder by considering such a work time. In this case, it is preferable that the supply section be configured to include multiple modules, and the predetermined period be set for each module. Since the movement time of the mobile work device differs between the modules, the management device can further appropriately execute the exchange of the feeder.

A mounting device according to the present disclosure is a mounting device which is used in a mounting system including any management device described above, the mounting device comprising: a mounting section configured to mount a component on a mounting target; a supply section configured to install a feeder configured to hold the component in an installation section which includes a mounting installation section, from which the mounting section is enabled to pick up the component, and a buffer installation section, from which the mounting section is not enabled to pick up the component; and a mounting control section configured to cause the mounting section to pick up the component from the feeder. The mounting control section may be configured to acquire the number of installation sections for exchange which is set by the management device, secure the buffer installation section of the number of installation sections for exchange to be used for exchange of a component shortage feeder, and use the buffer installation section of the number of installation sections for changeover in a pre-serving process of a changeover process of the feeder. In this mounting device, since the buffer installation section of the number of installation sections for exchange set by the management device described above is secured, the exchange of the feeder can be executed more efficiently.

A mounting system according to the present disclosure includes the management device described above, and the mounting device described above. Since the mounting system includes the management device and the mounting device described above, the exchange of the feeder can be executed more efficiently.

A management method according to the present disclosure, which is used in a mounting system that includes a mounting device, the mounting device comprising: a mounting section configured to mount a component on a mounting target; a supply section configured to install a feeder configured to hold the component in an installation section which includes a mounting installation section, from which the mounting section is enabled to pick up the component, and a buffer installation section, from which the mounting section is not enabled to pick up the component; and a mounting control section configured to cause the mounting section to pick up the component from the feeder, includes (a) step of acquiring the number of exchanges of the feeder which is exchanged due to component shortage within a predetermined period in the mounting installation section, and setting the number of installation sections for exchange to be used for exchange of the feeder in the buffer installation section based on the acquired number of exchanges; and (b) step of using the buffer installation section of the number of installation sections for changeover, which is based on the remaining number excluding the number of installation sections for exchange, in a pre-serving process of a changeover process of the feeder.

Similarly to the management device described above, in this management method, since the more appropriate number of installation sections for exchange can be secured and the remaining buffer installation sections can be more appropriately used for the changeover process, the exchange of the feeder can be more efficiently executed. In this management method, various aspects of the management device described above may be adopted, or steps for realizing each function of the management device described above may be added.

INDUSTRIAL APPLICABILITY

The present disclosure is applicable to the technical field of devices that picks up and mounts components.

REFERENCE SIGNS LIST

10: mounting system, 11: printing device, 12: print inspection device, 13: feeder storage section, 14: storage section PC, 15: mounting device, 16: automatic conveyance vehicle, 17: feeder, 18: loader, 18a: X-axis rail, 19: host PC, 20: mounting control section, 21: CPU, 23: memory section, 24: mounting condition information, 25: arrangement state information, 26: board processing section, 27: supply section, 28: mounting installation section, 29: buffer installation section, 30: mounting section, 31: head moving section, 32: mounting head, 33: nozzle, 35: communication section, 38: slot, 39: connecting section, 48: display section, 49: input device, 50: movement control section, 51: CPU, 53: memory section, 54: accommodation section, 55: exchange section, 56: moving section, 57: communication section, 60: management control section, 61: CPU, 63: memory section, 64: production plan information, 65: installation section utilization information, 67: communication section, S: board

The invention claimed is:

1. A management device which is used in a mounting system including a mounting device, the mounting device comprising: a mounting section configured to mount a component on a mounting target; a supply section configured to install a feeder configured to hold the component in an installation section, which includes a mounting installation section, from which the mounting section is enabled to pick up the component, and a buffer installation section, from which the mounting section is not enabled to pick up the component; and a mounting control section configured to cause the mounting section to pick up the component from the feeder,
wherein the management device further comprises a management control section configured to acquire the number of exchanges of the feeder which is exchanged due to component shortage within a predetermined period in the mounting installation section, set the number of installation sections for exchange to be used for exchange of the feeder in the buffer installation section based on the acquired number of exchanges, and use the buffer installation section of the number of installation sections for changeover, which is based on the remaining number excluding the number of installation sections for exchange, in a pre-serving process of a changeover process of the feeder.

2. The management device according to claim 1,
wherein the management control section is configured to set the number of exchanges, which is equal to or less than a maximum value among the number of exchanges for each predetermined period, to the number of installation sections for exchange in a production plan of the mounting target.

3. The management device according to claim 1,
wherein the management control section is configured to set a maximum number of exchanges of the feeder within the predetermined period to the number of installation sections for exchange in a production plan of the mounting target, and then reset a next maximum number of exchanges to the number of installation sections for exchange in a case in which the maximum number of exchanges is decreased after a predetermined period of the maximum number of exchanges has elapsed.

4. The management device according to claim 1,
wherein the supply section includes multiple modules, and
the management control section is configured to set the number of installation sections for exchange for each module.

5. The management device according to claim 4,
wherein the predetermined period is set for each module.

6. The management device according to claim 1,
wherein the supply section includes multiple modules, and
the management control section is configured to, in a case in which the module has a free buffer installation section, use the free buffer installation section for the pre-serving process of the changeover process of the feeder of another module.

7. The management device according to claim 1,
wherein the mounting system includes a mobile work device including a movement control section configured to collect the feeder from the supply section or replenishes the feeder to the supply section to move the feeder, and
the predetermined period is set based on a work time including movement of the mobile work device.

8. A mounting device which is used in a mounting system including the management device according to claim 1, the mounting device comprising:
a mounting section configured to mount a component on a mounting target;
a supply section configured to install a feeder configured to hold the component in an installation section which includes a mounting installation section from which the mounting section is able to pick up the component and a buffer installation section from which the mounting section is not able to pick up the component; and
a mounting control section configured to cause the mounting section to pick up the component from the feeder,
wherein the mounting control section is configured to acquire the number of installation sections for exchange which is set by the management device, secure the buffer installation section of the number of installation sections for exchange to be used for exchange of a component shortage feeder, and use the buffer installation section of the number of installation sections for changeover in a pre-serving process of a changeover process of the feeder.

9. A management method which is used in a mounting system that includes a mounting device, the mounting device comprising: a mounting section configured to mount a component on a mounting target; a supply section configured to install a feeder configured to hold the component in an installation section which includes a mounting installation section, from which the mounting section is enabled to pick up the component, and a buffer installation section, from which the mounting section is not enabled to pick up the component; and a mounting control section configured to cause the mounting section to pick up the component from the feeder, the method comprising:

(a) step of acquiring the number of exchanges of the feeder which is exchanged due to component shortage within a predetermined period in the mounting installation section, and setting the number of installation sections for exchange to be used for exchange of the feeder in the buffer installation section based on the acquired number of exchanges; and (b) step of using the buffer installation section of the number of installation sections for changeover, which is based on the remaining number excluding the number of installation sections for exchange, in a preserving process of a changeover process of the feeder.

* * * * *